(12) United States Patent
Quek

(10) Patent No.: US 7,154,330 B2
(45) Date of Patent: Dec. 26, 2006

(54) STABILITY COMPENSATION FOR ADJUSTABLE GAIN AMPLIFIER

(75) Inventor: Irene Quek, Singapore (SG)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 255 days.

(21) Appl. No.: 10/844,220

(22) Filed: May 12, 2004

(65) Prior Publication Data

US 2005/0253651 A1    Nov. 17, 2005

(51) Int. Cl.
*H03F 1/36* (2006.01)

(52) U.S. Cl. .................. 330/107; 330/109; 330/282; 330/294

(58) Field of Classification Search ................ None
See application file for complete search history.

(56) References Cited

U.S. PATENT DOCUMENTS 4,210,942 A * 7/1980 Nakamura et al. ............ 360/65
6,232,834 B1 * 5/2001 Zheng ........................ 330/107

* cited by examiner

Primary Examiner—Khanh V. Nguyen

(57) ABSTRACT

Stability compensation for an amplifier with adjustable gain is provided via adjustable capacitance coupled to an input of a gain element within the amplifier. Gain of the amplifier is adjusted by an adjustable resistance coupled between the input and output of the gain element. The adjustable capacitance and the adjustable resistance determine the frequency of a dominant pole of the amplifier.

16 Claims, 7 Drawing Sheets

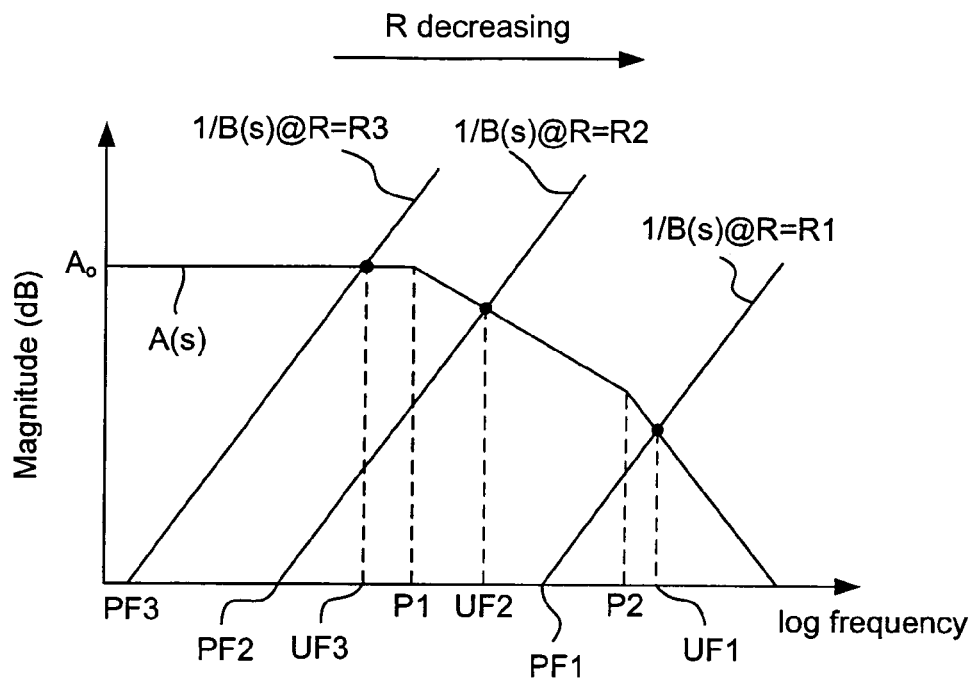
Figure 1C
*(PRIOR ART)*
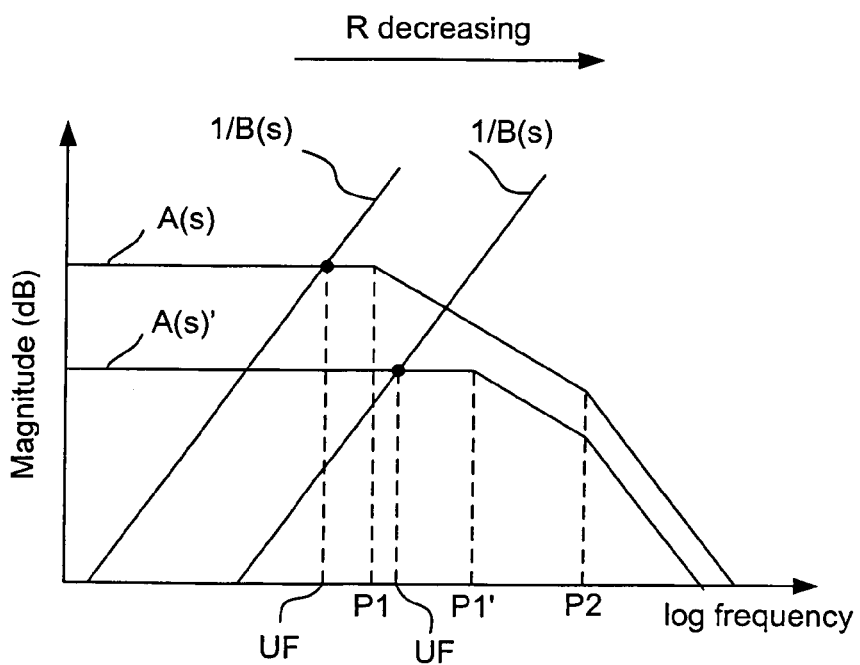
Figure 2 *(PRIOR ART)*

STABILITY COMPENSATION FOR ADJUSTABLE GAIN AMPLIFIER

BACKGROUND OF THE INVENTION

Amplifiers used in many types of communication systems and other high-speed applications provide amplified output signals, such as voltages, in response to applied input signals, such as currents. In these applications, the amplifiers have adjustable gain to accommodate a wide range of input signals. Gain adjustment is typically achieved via an adjustable feedback resistor included in a feedback path between an output and an input of a gain element included in the amplifier, as shown in FIG. 1A. Reducing the resistance of this feedback resistor lowers the gain of the amplifier and enables input signals having higher magnitude to be accommodated, while increasing the resistance increases the gain of the amplifier, enabling input signals having lower magnitude to be accommodated. However, if the resistance becomes low enough, gain peaking, ringing, oscillations or other instabilities could result in the amplifier. Accordingly, various compensation schemes have been employed to increase stability of the amplifier over the gain adjustment range of the amplifier.

One compensation scheme (shown in FIG. 2) maintains stability of the amplifier by decreasing the gain from a gain A(s) to a gain A(s)' and increasing the frequency of a dominant pole of the gain element included in the amplifier from a frequency P1 to a frequency P1'. This keeps the unity-gain frequencies UF of the loop-gain transfer function of the amplifier lower than the increased frequency P1' of the dominant pole of the gain element. However, if the feedback resistance is decreased enough for the unity-gain frequency of the loop-gain transfer function of the amplifier to approach the frequency P2 of a non-dominant pole of the gain element in the amplifier, instabilities in the amplifier may result. To keep the frequency P2 of the non-dominant pole of the gain element sufficiently high to maintain stable operation of the amplifier over a wide gain adjustment range using this compensation scheme, wafer substrates and fabrication processes that yield high-speed devices for the gain element are needed, which can result in higher manufacturing cost for the amplifiers.

An alternative compensation scheme shown in FIGS. 3A–3B adds a zero in the feedback path of the amplifier by coupling a capacitor in parallel with the adjustable feedback resistance. In this scheme, amplifier stability is enhanced when the frequency Z of the zero is less than a decade higher than the frequency P1 of the dominant pole of the gain element in the amplifier. However, in addition to the above constraint, amplifier stability is typically achieved when the unity-gain frequency UF of the loop-gain transfer function is also lower than the frequencies of the non-dominant pole P2 of the gain element. Accordingly, these constraints imposed by this compensation scheme make it difficult to achieve stability over a sufficiently wide gain adjustment range of the amplifier.

SUMMARY OF THE INVENTION

Embodiments of the present invention provide stability compensation for an amplifier with adjustable gain via an adjustable capacitance coupled to an input of a gain element within the amplifier. An adjustable resistance coupled between an output of the gain element and the input of the gain element adjusts the gain of the amplifier. The adjustable capacitance and the adjustable resistance determine the frequency of a dominant pole of the amplifier. An amplification method according to alternative embodiments of the present invention provides stability compensation for an amplifier with adjustable gain.

BRIEF DESCRIPTION OF THE DRAWINGS

FIGS. 1A–1C show aspects of a conventional amplifier.

FIG. 2 shows aspects of a first prior art compensation scheme for the conventional amplifier shown in FIG. 1A.

DETAILED DESCRIPTION OF THE EMBODIMENTS

Figure 1A:
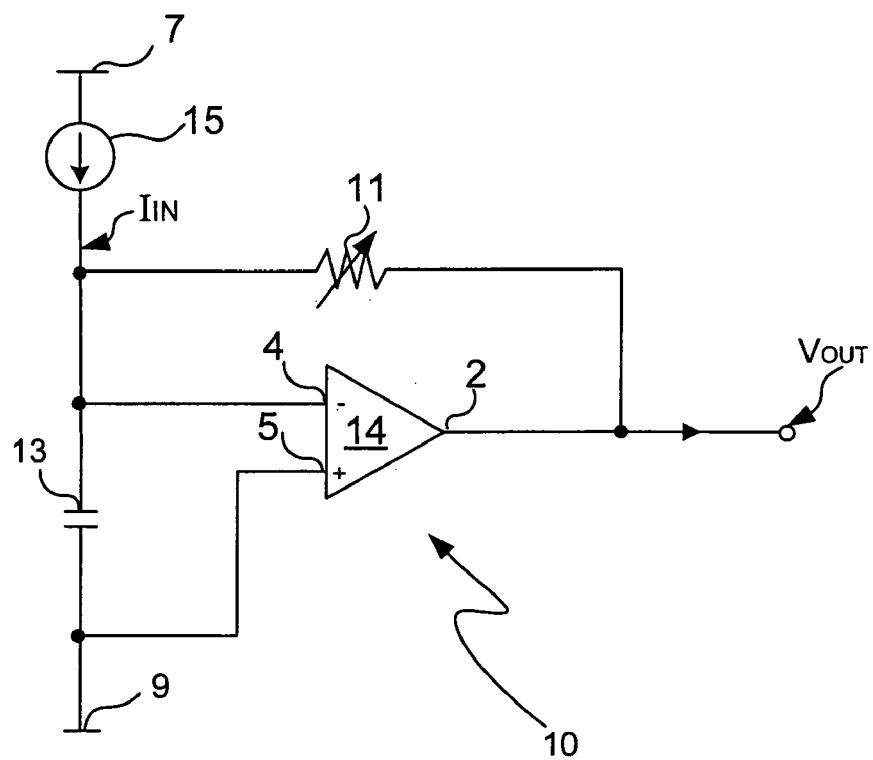

A conventional amplifier 10 with adjustable gain is shown in FIG. 1A. Gain is adjusted via an adjustable resistance R of a feedback resistor 11 coupled in a feedback path between output 2 and inverting input 4 of a gain element 14 included in the amplifier 10. The gain element 14 provides a voltage gain A(s), and is used in an inverting configuration in the amplifier 10 so that negative feedback is provided via the feedback resistor 11. In this example, the gain element 14 has two poles at pole frequencies $P_1$, $P_2$, which typically depend on parasitic parameters of the devices used to implement the gain element 14, and on the speed of the active devices in the gain element 14. In this example, a voltage $V_{OUT}$ is provided at the output 2 of the gain element 14 in response to a current $I_{IN}$ applied to the amplifier 10 from a signal source 15. The signal source 15 and non-inverting input 5 of the gain element 14 are coupled between nodes 7 and 9.

Figure 1B:
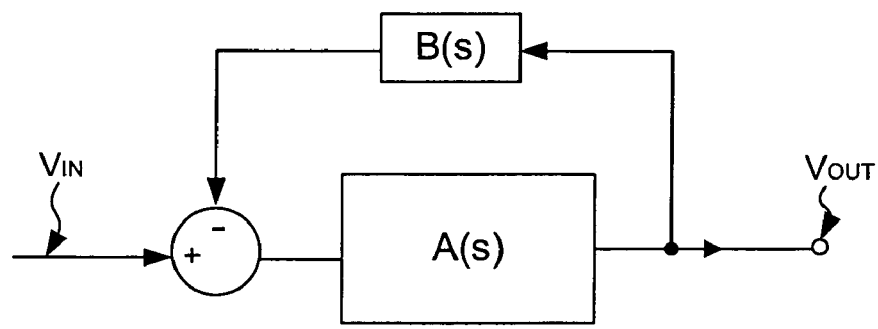
Figure 3A:
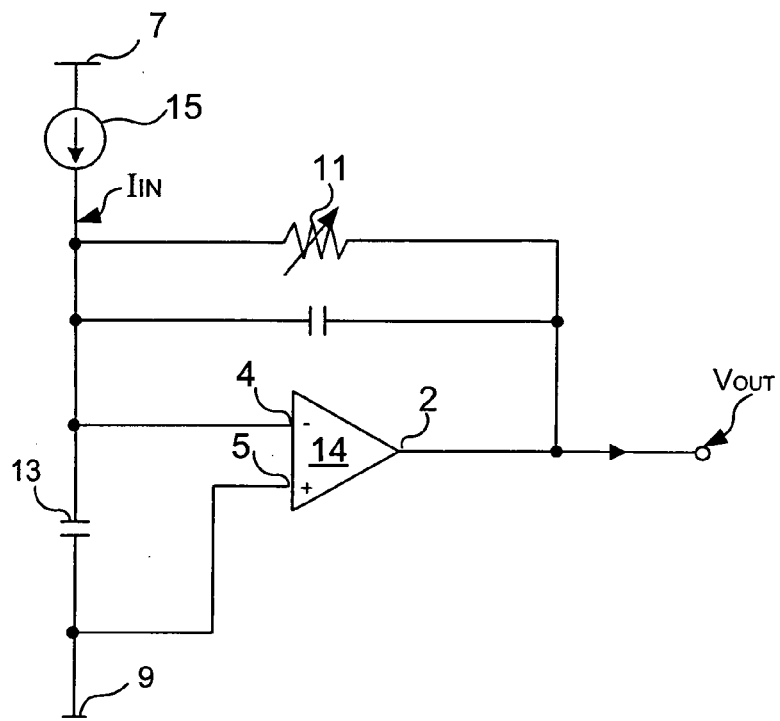
FIGS. 3A–3B show aspects of a second prior art compensation scheme for the conventional amplifier shown in FIG. 1A.
Figure 3B:
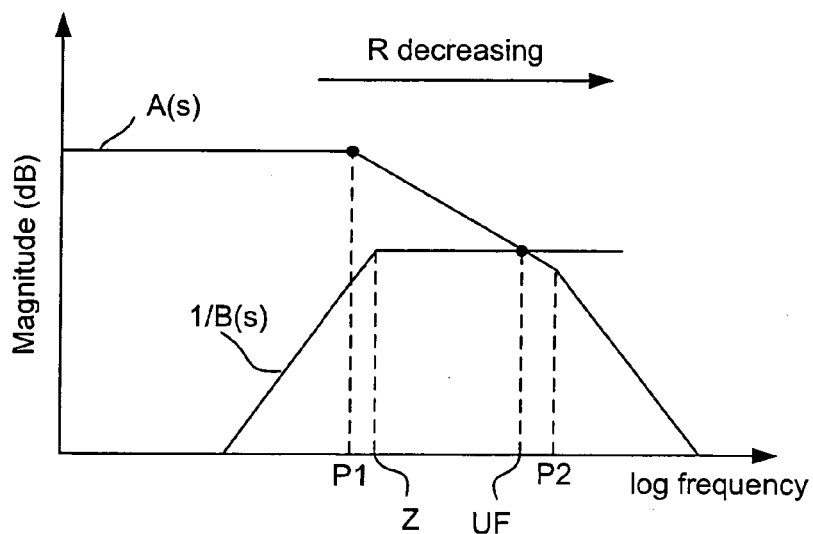

FIG. 1B shows a functional diagram of the amplifier 10. When the gain element has high input impedance, and low output impedance, the feedback path of the amplifier 10 has a transfer function $B(s)=1/(1+sRC)$, where C is the capacitance of a capacitor 13 coupled to the inverting input 4 of the gain element 14. The gain A(s) of the gain element 14 is expressed as $A(s)=A_0/((1+s/P1)(1+s/P2))$, where $A_0$ represents the low-frequency gain of the gain element 14. In this example, the gain element 14 has a dominant pole at a frequency P1 and a non-dominant pole at a frequency P2. On a linear scale, the loop-gain of the amplifier 10 is a product of the feedback function B(s) and the gain A(s). On a decibel magnitude scale, the loop gain of the amplifier 10 can be expressed as A(s)-1/B(s) where A(s), B(s) are each on a decibel magnitude scale.

FIG. 1C is a Bode plot of the gain A(s) of the gain element 14 versus frequency, where the gain A(s) is indicated on a decibel magnitude scale and a logarithmic frequency scale. The inverse 1/B(s) of the transfer function B(s) is also indicated on a decibel magnitude scale. FIG. 1C illustrates the well-known tradeoff between loop-gain A(s)*B(s) and operating bandwidth in feedback amplifiers. For example, as the trans-impedance gain $V_{OUT}/I_{IN}$ of the amplifier 10 decreases as a result of decreasing the resistance R of the feedback resistor 11, the operating bandwidth of the amplifier 10 correspondingly increases. The increase in bandwidth of the amplifier 10 is associated with an increase in the frequency $P_F$ of feedback pole of the transfer function B(s), determined by the resistance R and capacitance C. In the example shown, the resistance R is set to the values R1, R2, R3, where R1<R2<R3. These settings of the resistance R provide corresponding poles at pole frequencies $P_F$ equal to $P_{F1}$, $P_{F2}$, $P_{F3}$, where $P_{F1}$>$P_{F2}$>$P_{F3}$. These poles correspond to loop-gain unity-gain frequencies UF of UF1, UF2, UF3, where UF1>UF2>UF3. As the loop-gain unity-gain frequency UF of the amplifier increases, the loop-gain unity-gain frequency UF gets closer to the pole frequency P1 of the gain element 14, which can induce gain peaking, ringing, oscillations or other amplifier instabilities.

Figure 4A:
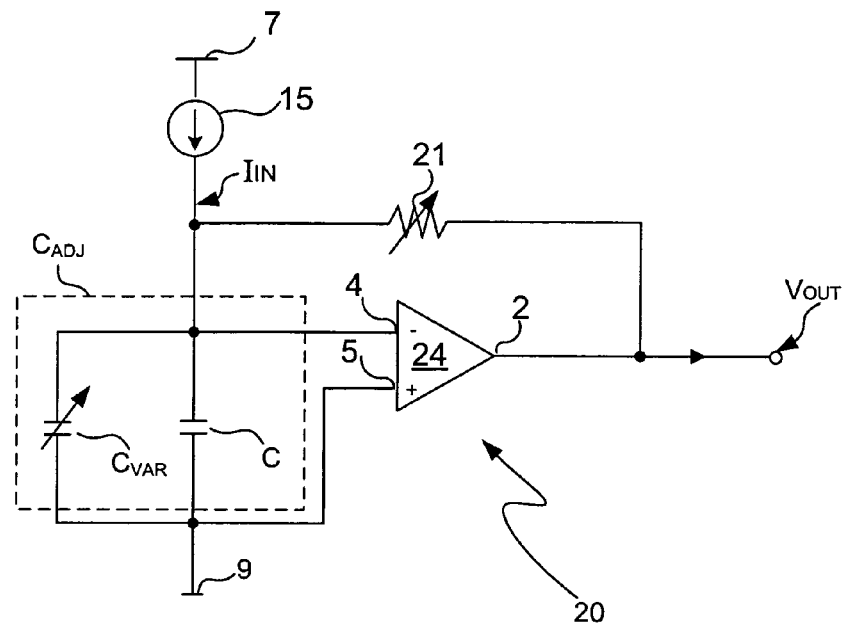
FIGS. 4A–4D show amplifiers with stability compensation according to embodiments of the present invention.

According to embodiments of the present invention, stability compensation is provided in an amplifier 20 with adjustable gain, as shown in FIG. 4A. Gain of the amplifier 20 is adjusted via the resistance R of an adjustable feedback resistor 21 coupled in a feedback path between the output 4 and the inverting input 2 of the gain element 24 included in the amplifier 20. Stability for the amplifier 20 is achieved over the gain adjustment range of the amplifier 20 by coupling an adjustable capacitance $C_{ADJ}$ to the inverting input 4 of the gain element 24 in the amplifier 20. The gain element 24 is typically implemented with an operational amplifier or with an amplifier with discrete transistors or other semiconductors that provide high input impedance, low output impedance and high gain.

Figure 5:
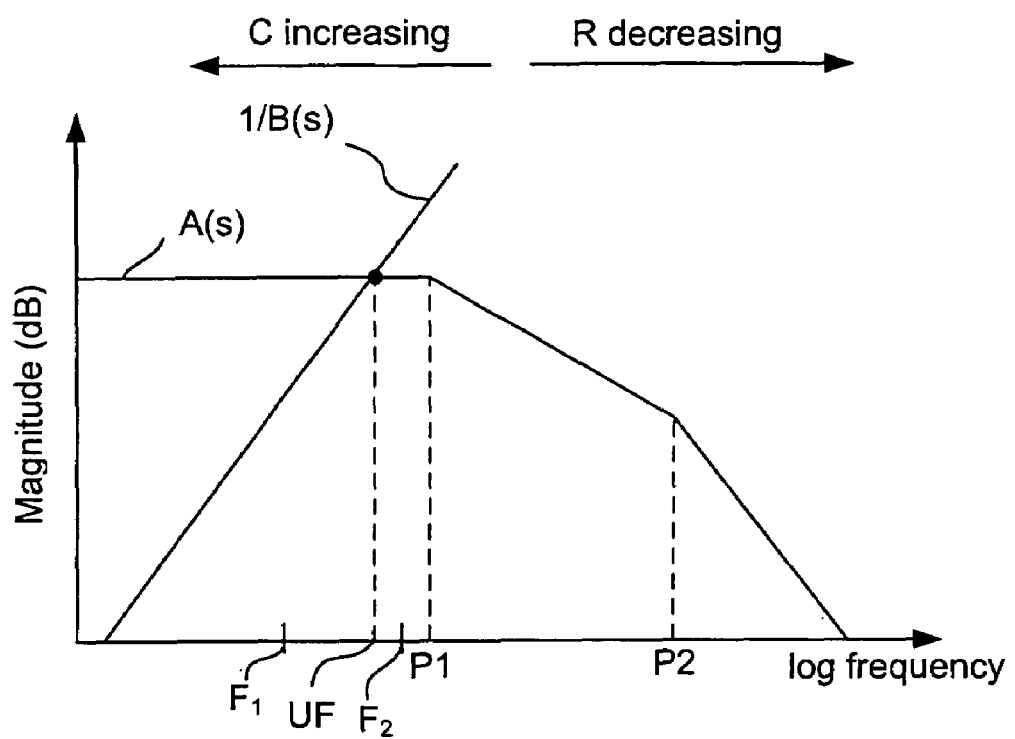
FIG. 5 shows an exemplary plot of gain versus frequency for the amplifiers of FIGS. 4A–4D.

FIG. 5 shows the dependence of the frequency $P_{FB}$ of the feedback pole in the amplifier 20 on the resistance R and the adjustable capacitance $C_{ADJ}$, where the frequency $P_{FB}$=1/(2ρR$C_{ADJ}$). FIG. 5 illustrates that independently decreasing the resistance R increases the frequency $P_{FB}$, while independently increasing the adjustable capacitance $C_{ADJ}$ decreases the frequency $P_{FB}$. Therefore, the adjustable capacitance $C_{ADJ}$ can be increased to counteract decreases in the resistance R that reduce the gain of the amplifier 20. Adjustments of the capacitance $C_{ADJ}$ in response to adjustments in the resistance R can be made to maintain the loop-gain unity-gain frequency UF of the amplifier 20 within a designated range between frequencies F1–F2. The frequency range F1–F2 is typically designated to ensure stability of the amplifier 20 while maintaining sufficiently high operating bandwidth for the amplifier 20. The loop-gain unity-gain frequency UF is the frequency that corresponds to the magnitude of the loop-gain A(s)B(s) being equal to one. The loop-gain unity-gain frequency UF is indicated in FIG. 5 by the intersection of the contour of the gain A(s) with the contour of the inverse of the transfer function B(s) indicated as 1/B(s).

Maintaining a constant product of the resistance R and the adjustable capacitance $C_{ADJ}$ maintains a constant pole frequency $P_{FB}$ and constant loop-gain unity-gain frequency UF. However, even when a constant product R*$C_{ADJ}$ is not maintained, the capacitance $C_{ADJ}$ can be increased for decreases in the resistance R to maintain sufficient phase margin in the amplifier 20 to provide stable operation over a wide gain adjustment range of the amplifier 20. For example, with the capacitance $C_{ADJ}$ increased enough to set the loop-gain unity-gain frequency of the amplifier 20 below the frequency of the dominant pole P1 of the gain element 24, phase margin in excess of 45 degrees can be achieved.

Figure 4B:
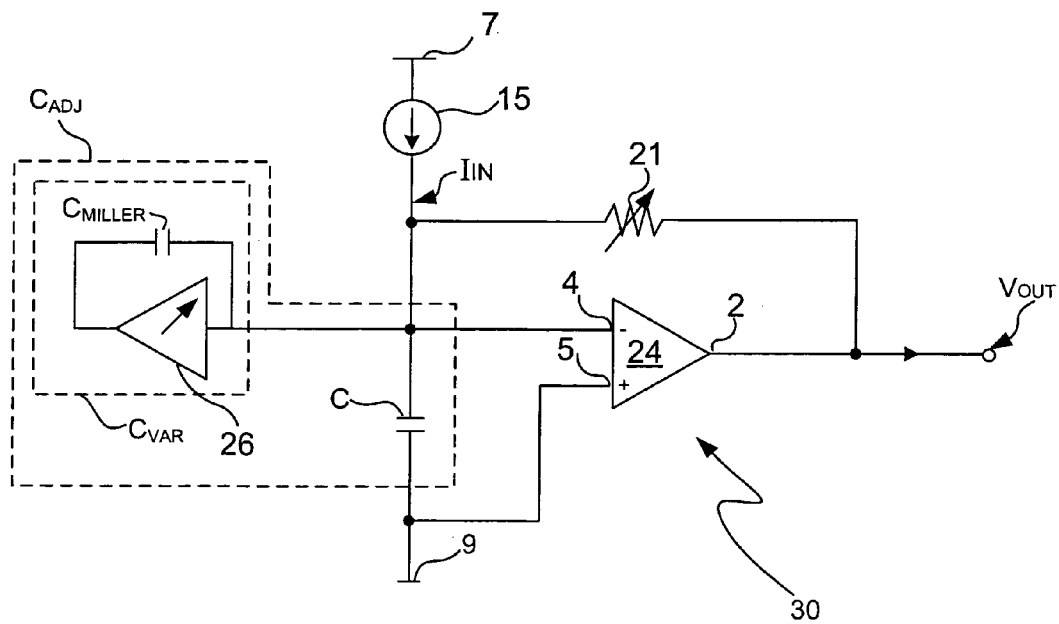
Figure 4C:
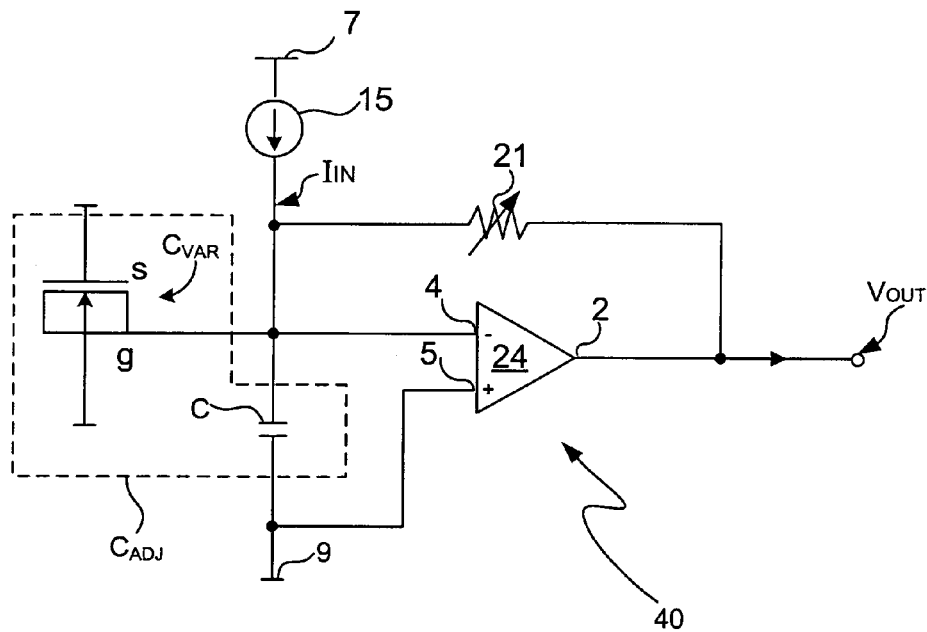
Figure 4D:
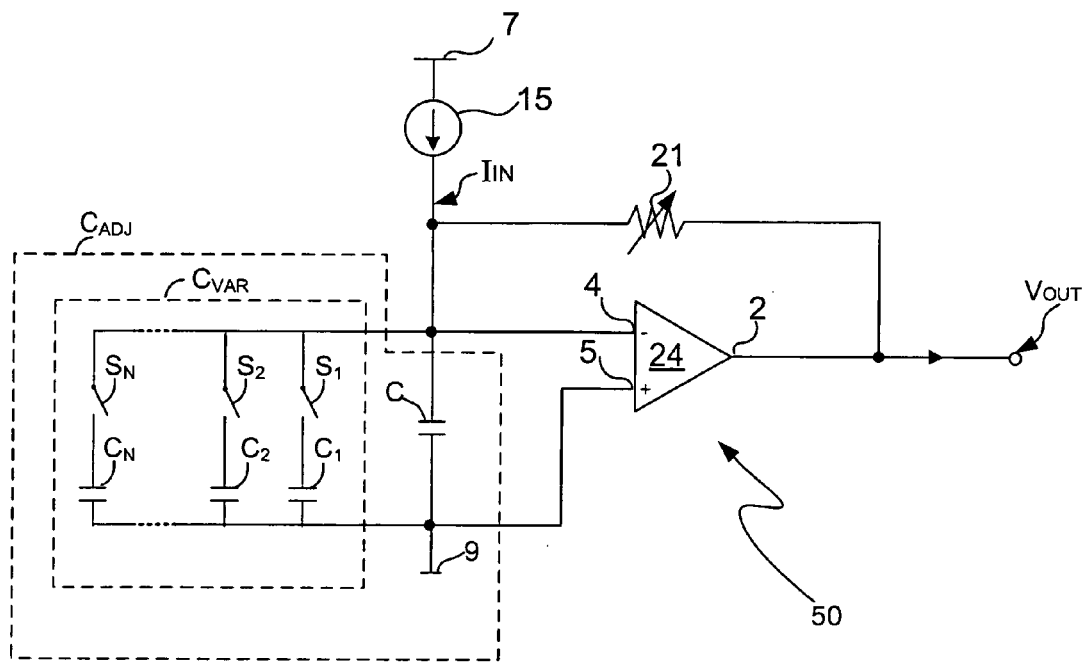

The adjustable capacitance $C_{ADJ}$ is typically implemented with a fixed capacitance C in parallel with a variable capacitor $C_{VAR}$. FIGS. 4B–4D show alternative implementations of the amplifier 20 according to alternative embodiments of the present invention. In an amplifier 30 shown in FIG. 4B, the variable capacitor $C_{VAR}$ in the adjustable capacitance $C_{ADJ}$ is implemented using the Miller effect, wherein the variable capacitor $C_{VAR}$ is varied via variations in gain $A_{MILLER}$ in a Miller amplifier 26. Here, the variable capacitor $C_{VAR}$=(1+$A_{MILLER}$)$C_{MILLER}$.

In an amplifier 40 shown in FIG. 4C, the variable capacitor $C_{VAR}$ is implemented via a control voltage $V_{CONTROL}$ or control current (not shown) imposed across a semiconductor junction, such as the gate-source junction of an NMOS device, a varactor diode, or other type of semiconductor 42. In this example, the variable capacitor $C_{VAR}$ is adjusted in response to a control voltage $V_{CONTROL}$ imposed across a semiconductor junction between the gate g and the source s of the NMOS device. In an amplifier 50 shown in FIG. 4D, the variable capacitor $C_{VAR}$ in the adjustable capacitance $C_{ADJ}$ is implemented via a series of switched capacitors $C_1$–$C_N$, where the one or more of the capacitors $C_1$–$C_N$ can be selectively coupled in parallel with the inverting input 4 of the gain element 24 via switches $S_1$–$S_N$.

Figure 6:
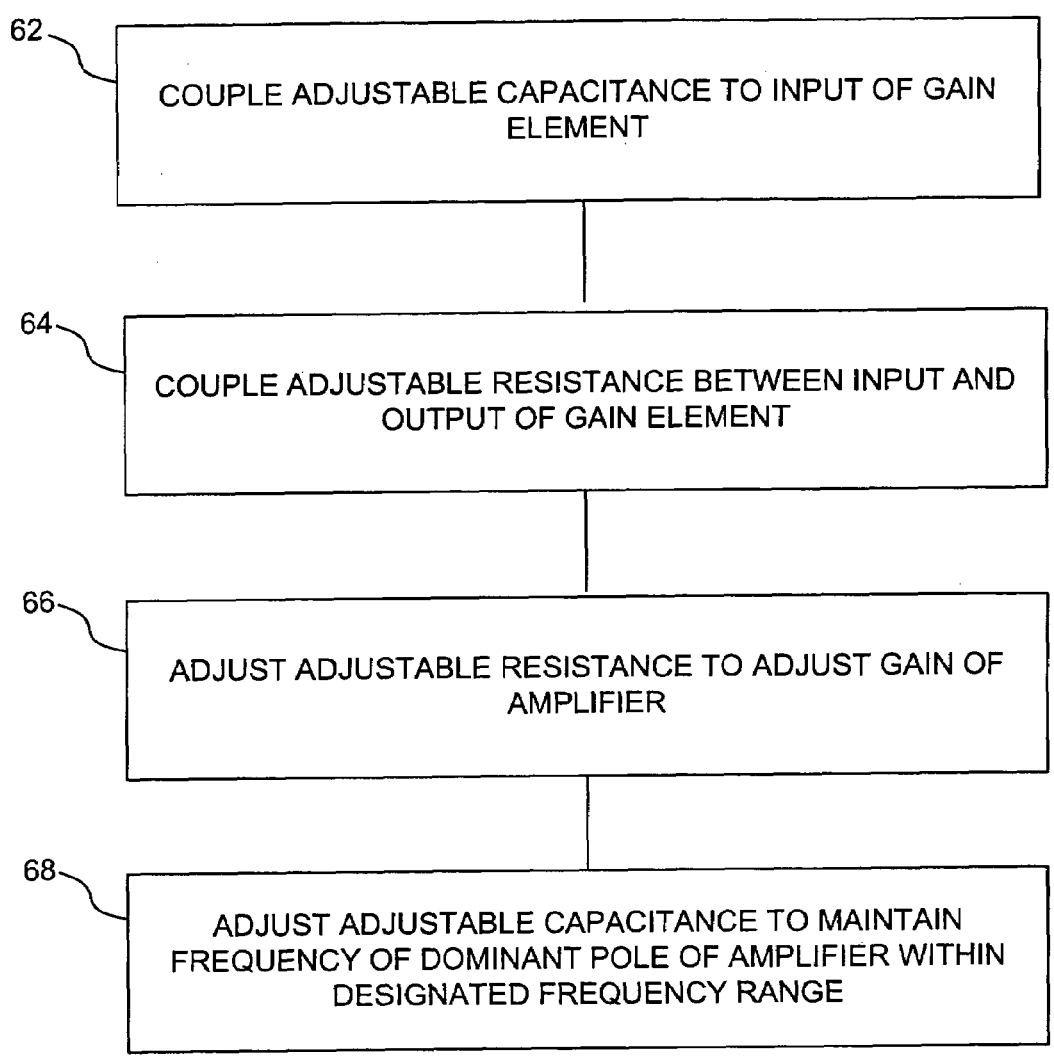
FIG. 6 is a flow diagram of a amplification method according to alternative embodiments of the present invention.

An amplification method according to alternative embodiments of the present invention provides stability compensation for an amplifier with adjustable gain. The amplification method 60 is shown in the flow diagram of FIG. 6. The amplification method 60 includes coupling the adjustable capacitance $C_{ADJ}$ to the input 4 of the gain element 24 (step 62) and coupling the adjustable resistor 11 between the input 4 and the output 2 of the gain element 24 (step 64) to form the variable gain amplifier 20. The amplification method then includes adjusting the adjustable resistor 11 to adjust the gain of the amplifier 20 (step 66) and adjusting the adjustable capacitance $C_{ADJ}$ to maintain the loop-gain unity-gain frequency of the amplifier 20 within the designated frequency range F1–F2 that is below the frequency P1 of the dominant pole of the gain element 24 (step 68).

In the exemplary embodiments of the present invention, the adjustable capacitance $C_{ADJ}$ is shown implemented with a fixed capacitor C in series with a variable capacitor $C_{VAR}$. The adjustable capacitance $C_{ADJ}$ is alternatively implemented with a single variable capacitor, or with a series arrangement of capacitors or other elements, devices or systems that provide capacitance that can be adjusted.

While the embodiments of the present invention have been illustrated in detail, it should be apparent that modifications and adaptations to these embodiments may occur to one skilled in the art without departing from the scope of the present invention as set forth in the following claims.

The invention claimed is:

1. An amplifier, comprising:
   a gain element;
   an adjustable capacitance coupled to an input of the gain element; and
   an adjustable resistance coupled between an output of the gain element and the input of the gain element, the amplifier having a gain set by the adjustable resistance and having a dominant pole at a frequency according to the adjustable capacitance and the adjustable resistance;
   wherein the adjustable capacitance is adjusted to maintain the frequency of the dominant pole within a designated frequency range.

2. The amplifier of claim 1 wherein a decrease in the adjustable resistance is accompanied by an increase in the adjustable capacitance.

3. The amplifier of claim 1 wherein the adjustable capacitance includes a fixed capacitance and a variable capacitance in parallel with the fixed capacitance.

4. The amplifier of claim 3 wherein the adjustable capacitance includes a fixed capacitance and a variable capacitance in parallel with the fixed capacitance.

5. The amplifier of claim 1 wherein the adjustable capacitance includes a semiconductor junction having an associated capacitance that is varied by at least one of a control voltage and a control current.

6. The amplifier of claim 3 wherein the variable capacitance includes at least one parallel capacitor selectively coupled to the input of the gain element via at least one switch.

7. The amplifier of claim 1 wherein the gain element has at least one dominant pole, at least one corresponding pole frequency that is higher in frequency than the designated frequency range.

8. The amplifier of claim 1 further comprising a signal source providing a current to a node connecting the adjustable capacitance to the adjustable resistance.

9. An amplification method, comprising:
  forming an amplifier by coupling an adjustable resistance between an input and an output of a gain element, and by coupling an adjustable capacitance to the input of the gain element, wherein the amplifier has a dominant pole at a frequency according to the adjustable capacitance and the adjustable resistance;
  adjusting the adjustable resistance to adjust the gain of the amplifier; and
  adjusting the adjustable capacitance to maintain the frequency of the dominant pole within a designated frequency range.

10. The amplification method of claim 9 wherein the gain element has at least one pole, at at least one corresponding pole frequency that is higher than the designated frequency range.

11. The amplification method of claim 9 wherein a decrease in the adjustable resistance is accompanied by an increase in the adjustable capacitance.

12. The amplification method of claim 9 wherein the adjustable capacitance includes a fixed capacitance and a variable capacitance in parallel with the fixed capacitance.

13. The amplification method of claim 11 wherein the adjustable capacitance includes a fixed capacitance and a variable capacitance in parallel with the fixed capacitance.

14. The amplification method of claim 9 wherein the adjustable capacitance includes a semiconductor junction having an associated capacitance that is varied by at least one of a control voltage and a control current.

15. The amplification method of claim 13 wherein the variable capacitance includes at least one parallel capacitor selectively coupled to the input of the gain element via at least one switch.

16. The amplification method of claim 9 further comprising applying a current to a node connecting the adjustable capacitance to the adjustable resistance.

* * * * *